United States Patent
Haugestuen

(10) Patent No.: US 7,626,435 B2
(45) Date of Patent: Dec. 1, 2009

(54) HIGH RESOLUTION DELAY LINE ARCHITECTURE

(75) Inventor: Benjamin Haugestuen, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 490 days.

(21) Appl. No.: 11/191,110

(22) Filed: Jul. 27, 2005

(65) Prior Publication Data

US 2007/0024339 A1    Feb. 1, 2007

(51) Int. Cl.
*H03H 11/26* (2006.01)

(52) U.S. Cl. .................. 327/284; 327/261; 327/276; 327/277

(58) Field of Classification Search .............. 327/261, 327/284, 285, 263, 264, 296, 271, 272, 276–278, 327/158, 155, 161, 162, 355–357, 368, 360–361
See application file for complete search history.

(56) References Cited

U.S. PATENT DOCUMENTS

| 5,764,096 | A   | * | 6/1998  | Lipp et al. ............... 327/434 |
| 6,390,579 | B1  | * | 5/2002  | Roylance et al. ............ 347/9 |
| 6,642,760 | B1  | * | 11/2003 | Alon et al. ................ 327/158 |
| 6,774,693 | B2  | * | 8/2004  | Carr ....................... 327/276 |
| 7,135,906 | B2  | * | 11/2006 | Takai et al. ............... 327/263 |
| 7,154,323 | B2  | * | 12/2006 | Yamawaki ................. 327/277 |
| 2005/0242864 | A1 | * | 11/2005 | Kawasaki et al. .......... 327/261 |
| 2006/0066372 | A1 | * | 3/2006  | Collins et al. ............. 327/284 |
| 2006/0087353 | A1 | * | 4/2006  | Minzoni et al. ........... 327/158 |

* cited by examiner

*Primary Examiner*—Lincoln Donovan
*Assistant Examiner*—Colleen O'Toole

(57) ABSTRACT

A delay line architecture is presented. In one embodiment, the delay line is used to introduce delay compensation into a circuit design at the top level of the circuit design.

11 Claims, 1 Drawing Sheet

HIGH RESOLUTION DELAY LINE ARCHITECTURE

BACKGROUND OF THE INVENTION

Description of the Related Art

In conventional memory controllers, memory processors are built into an integrated circuit design and used to control data rate transfers to and from an external random access memory (RAM). Delay lines are used to delay the chip and RAM clocks by a certain amount to guarantee reliable transfer of data to and from the RAM. Many conventional delay line architectures include a multiplexer/buffer design.

There are several disadvantages to the multiplexer/buffer design. For example, a multiplexer/buffer design architecture reduces delay line resolution (i.e., ability to individually control each delay line) and increases duty cycle distortion. Duty cycle distortion occurs when the rise time of the leading edge of a signal propagated through the multiplexer/buffer design is different from a fall time of the falling edge of a signal propagated through the multiplexer/buffer design. This is a substantial problem when clock signals are propagated through the multiplexer/buffer design and the rise time of the clock signal is different from the fall time of the clock signal. In addition, to the duty cycle distortion, depending on the elements used to implement the multiplexer (i.e., pass gates and levels of logic), the multiplexer/buffer design is a very slow architecture. This in turn slows down the processing of signals through the delay line architecture. Low resolution in the delay lines, slow delay elements and a high amount of duty cycle distortion makes it very difficult to meet timing constraints (i.e., set up and hold time constraints).

Thus, there is a need for a new delay line design with higher resolution and minimal duty cycle distortion. There is a need for a delay line that can meet required timing constraints. Lastly, there is a need for a faster delay line architecture.

SUMMARY OF THE INVENTION

In accordance with the teachings of the present invention, a delay line architecture is presented. The delay line architecture provides for higher resolution, minimal duty cycle distortion and meets required timing constraints.

A delay line architecture implemented in accordance with the teachings of the present invention includes fast delay elements and higher delay line resolution. As a result, a user can accurately specify delay for the delay line, reducing the delay line's margin of error. In addition, a minimal number of logic elements are selected and configured to provide for lower duty cycle distortion. The logic elements and configuration where also selected to prevent glitches when switching the delay line settings. Lastly, power save circuitry is included in the delay line. As a result, when only a portion of the delay line is being used, switching of unused delay elements is prevented, reducing power consumption.

A delay line comprises a plurality of delay line elements each comprising logical gates configured to provide an equal amount of rise time and fall time transitions between each of the plurality of delay line elements.

A delay line, comprises an input selection line generating an input selection signal; a first delay element including an input conveying an input signal and a first NAND gate driving a first output signal; and a second delay element coupled to the first delay element and coupled to the input selection line, the second delay element comprising, a second NAND gate coupled to the input, the second NAND gate generating a second output signal in response to the input signal conveyed on the input, a third NAND gate generating coupled to input and coupled to the input selection line, the third NAND gate generating a third output signal in response to the input signal conveyed on the input and in response to the input selection signal generated on the input selection line, a fourth NAND gate the fourth NAND gate coupled to the input and coupled to the input selection line and generate the third output signal in response to the input selection signal, the first NAND gate driving the first output signal in response to the second output signal and in response to the third output signal.

A delay line comprises an input selection line generating a selection signal; a previous delay element generating a first signal; a last delay element generating a return signal in response to the first signal; a middle delay element coupled between the previous delay element and the last delay element, and coupled to the input selection line, the middle delay element comprising, a first NAND gate capable of passing the first signal from the previous delay element to the last delay element; a second NAND gate receiving the first signal from the previous delay element and the selection signal from the input selection line, the second NAND gate capable of outputting a second signal to the previous delay element in response to the first signal and in response to the selection signal and a third NAND gate capable of outputting a third signal to the previous delay element in response to the selection signal and in response to the return signal.

DETAILED DESCRIPTION

Figure 1:
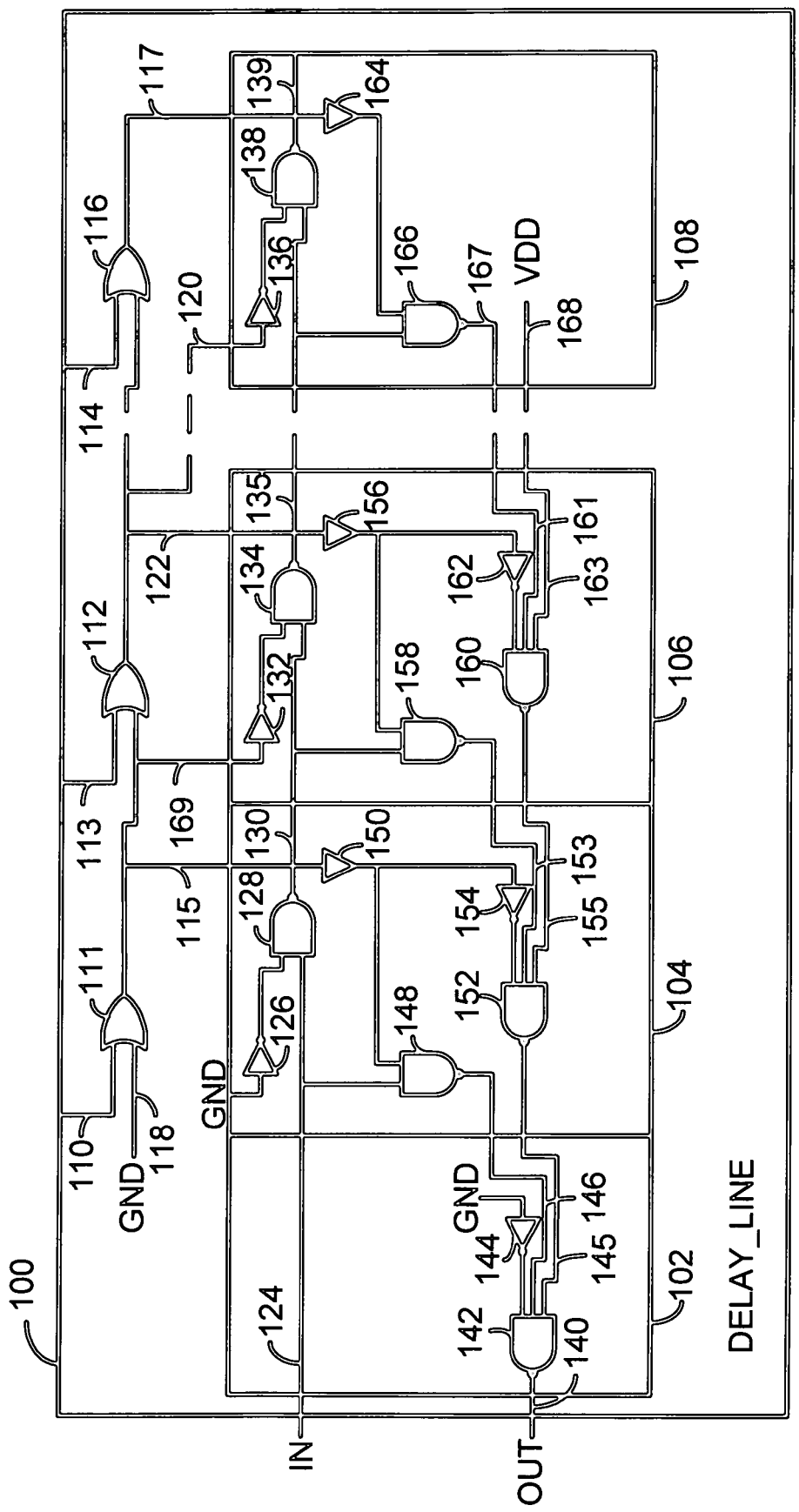
FIG. 1 displays a delay line architecture implemented in accordance with the teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The building block of a delay line is the delay element. In accordance with the teachings of the present invention a delay element is implemented with three NAND gates. The NAND gates are configured to balance any differences between rise and fall times. This is accomplished by implementing an equal amount of rise and fall transitions through each delay element gate, balancing out any differences between rise and fall times. As a result, the three NAND gate design for the delay element greatly reduces duty cycle distortion. In addition, transistor components of the delay element are optimized to be as fast as possible and also to prevent glitches when switching.

In accordance with the teachings of the present invention, the delay line contains logic that accepts a single select bus, coming from a memory controller. The single select bus sets all the delay elements prior to the selected delay element. The single select bus is used to implement a power save feature that prevents unused delay elements from needlessly switching.

The layout of each delay element enables the delay element to connect by abutment at the delay line level. This minimizes the routing between delay elements and keeps the delay consistent from one element to the next (i.e., previous element, middle element, next element).

FIG. 1 displays a delay line architecture implemented in accordance with the teachings of the present invention. A delay line 100 is shown. The delay line 100 includes N delay elements (i.e., a plurality of delay elements) such as a first delay element 102, a second delay element 104, a third delay element 106 and an nth delay element 108, where 108 represents any number of delay elements. In one embodiment, the first delay element 102 is implemented with a single NAND gate and may be referred to as a single NAND gate design. In one embodiment, the second delay element 104 and the third delay element 106 may be considered middle delay elements that are each implemented three NAND gates, which may be refereed to as a three NAND gate design. The nth delay element 108 may be considered the last delay element in the delay line 100 and is implemented with two NAND gates, which may be referred to as a two NAND gate design.

With the exception of the first delay element 102 each delay element such as the second delay element 104, the third delay element 106 and the nth delay element 108 are each associated with a selection input shown as 110, 113 and 114, respectively. Each selection input (i.e., 110, 113 and 114) is associated with an OR gate 111, 112 and 116 that generates an input for the second delay element 104, the third delay element 106 and the nth delay element 108. The output of OR gate 111 comes into the second delay element 104 on line 115, the output of OR gate 112 comes into the third delay element 106 on line 122 and the output of OR gate 116 comes into the nth delay element 108 as line 117. The connection of OR gates 111, 112 and 116 comprise a single select bus which is an advantageous feature of the present invention.

The first delay element 102 includes an input 124 for receiving an input signal. In addition, a NAND gate 142 drives an output 140. The NAND gate 142 receives input from an inverter 144, which is tied to ground and connections 145 and 146, which convey signals that are generated in the second delay element 104, by NAND gates 148 and 152, respectively.

Each of the middle delay elements such as the second delay element 104, and the third delay element 106 include a three NAND gate design. For example, in the second delay element 104, a NAND gate 128, a NAND gate 148 and a NAND gate 152 are shown. The NAND gate 128 receives the input 124 (i.e., input from previous delay element, such as the first delay element 102) and a signal from inverter 126, which is connected, to ground. NAND gate 128 then generates an output which is conveyed on connection 130. NAND gate 148 also receives two inputs. The first is from input 124. The second input to NAND gate 148 is the output of OR gate 111, which is conveyed on connection 115 and buffered by buffer 150. NAND gate 148 then generates an output on connection 146, which provides an input to NAND gate 142 positioned in the first delay element 102. NAND gate 152 receives three inputs. The first input to NAND gate 152 is the output of OR gate 111 which is conveyed on connection 115, buffered by buffer 150 and then inverted by inverter 154. The second and third inputs to NAND gate 152 are conveyed on connections 153 and 155 and are generated by NAND gates 158 and NAND gate 160, respectively, which are positioned in the third delay element 106.

In the third delay element 106, a NAND gate 134, a NAND gate 158 and a NAND gate 160 are shown. The NAND gate 134 receives input on connection 130 from NAND gate 128 and a signal from inverter 132 that is connected to ground. NAND gate 134 then generates an output that is conveyed on connection 135. NAND gate 158 also receives two inputs. The first input is generated by NAND gate 128 and conveyed on connection 130. The second input to NAND gate 158 is the output of OR gate 112, which is conveyed on connection 122 and buffered by buffer 156. NAND gate 158 then generates an output on connection 153, which provides an input to NAND gate 152 positioned in the first delay element 104. NAND gate 160 receives three inputs. The first input to NAND gate 160 is the output of OR gate 112 which is conveyed on connection 122, buffered by buffer 156 and then inverted by inverter 162. The second and third inputs to NAND gate 160 are conveyed on connections 161 and 163 and are generated by NAND gates 166 and VDD 168, which are positioned in the nth delay element 108.

The nth delay element 108 includes a two NAND gate design. The NAND gate 138 receives input on connection 135 from NAND gate 134 and a signal from inverter 136, which is connected to a power save line 120. NAND gate 138 then generates an output, which is conveyed on connection 139. NAND gate 166 also receives two inputs. The first input is generated by NAND gate 134 and conveyed on connection 135. The second input to NAND gate 166 is the output of OR gate 116, which is conveyed on connection 117 and buffered by buffer 164. NAND gate 166 then generates an output on connection 167, which provides an input to NAND gate 160 positioned in the third delay element 106.

During operations a signal such as a clock signal is communicated on input 124. The signal passes through the first delay element 102 and goes into the second delay element 104. To select an amount of delay, the first delay element 102, the second delay element 104, the third delay element 106 and the nth delay element 108 may be selected. A delay element is selected using a selection input 110, 113 or 114. Selecting a delay element such as the first delay element 102, the second delay element 104, the third delay element 106 and the nth delay element 108 causes a signal to turn around at the delay element and return back in the other direction. As a result, a predetermined amount of delay is implemented in the delay line 100 by selecting a number of delay elements.

To select a delay element (i.e., 104, 106, 108) a logical 1 is conveyed on input selection (i.e., 110, 113, 114) associated with that delay element (i.e., 104, 106, 108). The OR gate 111 will then generate a logical 1 which will also propagate through the OR gate 112 and the OR gate 116. Therefore, each of the OR gates (i.e., 111, 112, 116) connected after the selected OR gate (i.e., 111) will receive an input of a logical 1 and output a logical 1. In one embodiment, a selected delay element (i.e., 104, 106, 108) returns the signal, such as a clock signal input into the delay line 100. As such, the selected delay element may be referred to as a return delay element, since the selected delay element returns the signal propagating through the delay line 100. Further, for the purposes of discussion, the signal returned by the return delay element may be referred to as a return signal.

To select the second delay element 104, the first OR gate 111 is set with a logical 1. The logical 1 comes into the second delay element 104 and provides input into NAND gates 148 and 152. The logical 1 is conveyed on connection 115 and buffered by buffer 150. The logical 1 is then input to NAND gate 148. After the buffer 150 the logical 1 is inverted by inverter 154 and a logical zero is input into NAND gate 152. The input of a logical zero forces the NAND gate 152 to a logical one. Forcing NAND gate 152 to generate a logical one enables the NAND gate 148 to pass the signal on the input 124 back to the first delay element 102 as an input to NAND gate 142. If the input select line 110 is set to zero the signal on the input 124 will pass through the NAND gate 128 and will go into the third delay element 106. It should be appreciated that when the input conveys a clock signal an even number of NAND gates is preferable.

To select the third delay element 106, the input select line 113 communicates a logical 1 and the OR gate 112 generates a logical 1 onto connection 122. The logical 1 comes into the third delay line 106 and provides input into NAND gates 158 and 160. The logical 1 is conveyed on connection 122 and buffered by buffer 156. The logical 1 is then input to NAND gate 158. After the buffer 156 the logical 1 is inverted by inverter 162 and a logical zero is input into NAND gate 160. The input of a logical zero forces the NAND gate 160 to generate a logical one. Forcing NAND gate 160 to generate a logical one enables the NAND gate 158 to pass the signal communicated on connection 130 (i.e., generated by NAND gate 128) back to the second delay element 104 as an input to NAND gate 152. If the input select line 113 is set to zero the signal on connection 130 will pass through the NAND gate 134 and will go into the nth delay element 108.

To select the nth delay element 108, the input select line 114 communicates a logical 1 and the OR gate 116 generates a logical 1 unto connection 117. The logical 1 comes into the nth delay element 108 and provides input into NAND gates 166. The logical 1 is conveyed on connection 117 and buffered by buffer 164. The logical 1 is then input to NAND gate 166. Since this is the nth delay element 108, the output of NAND gate 166 is returned to the previous delay element (i.e., third delay element 106). A VDD signal is also input into NAND gate 160 on connection 168.

In accordance with the teachings of the present invention a power save feature is implemented. If the second delay element 104 is selected a logical 1 is communicated on the input selection line 110. A logical 1 is then generated by the OR gate 111. The logical 1 is conveyed on connection 169 and inverted by inverter 132. A logical zero is then input to NAND gate 134. The logical 1 will turn off delay element 106. The same process will occur for each of the delay elements (i.e., 106, 108) after the selected delay element. As such, these delay elements will not perform any switching and power will be saved in the delay line 100.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A delay line comprising:
a plurality of delay elements each comprising logical gates configured to provide an equal number of rise and fall time transitions between each of the plurality of delay elements;
a select bus connecting each of the plurality of delay elements to a memory controller, the select bus enabling individual selection of each of the plurality of delay elements;
wherein delay elements following a selected delay element will not perform any switching;
wherein the plurality of delay elements further comprise a first delay element receiving an input signal to the delay line, wherein the first delay element is implemented with a single NAND gate design.

2. A delay line as set forth in claim 1, the logical gates further comprising three NAND gates.

3. A delay line as set forth in claim 1, further comprising transistor elements wherein the transistor elements are optimized for faster transition.

4. A delay line as set forth in claim 1, wherein the plurality of delay elements are each connected by abutment at the delay line level.

5. A delay line as set forth in claim 1, wherein the plurality of delay elements further comprising a last delay element positioned as a last delay element to receive an input signal to the delay line, wherein the last delay element is implemented with a two NAND gate design.

6. A delay line as set forth in claim 1, the plurality of delay elements further comprising a first delay element implemented with a plurality of middle delay elements each implemented with three NAND gates and a last delay element implemented with two NAND gates.

7. A delay line as set forth in claim 1, the plurality of delay line elements further comprising,
an input selection line generating an input selection signal;
a second delay element coupled to the first delay element and coupled to the input selection line, the second delay element comprising,
a second NAND gate coupled to the input signal, the second NAND gate generating a second output signal in response to the input signal conveyed on the input,
a third NAND gate coupled to the input signal and coupled to the input selection line, the third NAND gate generating a third output signal in response to the input signal conveyed on the input and in response to the input selection signal generated on the input selection line,
a fourth NAND gate coupled to the input signal and coupled to the input selection line and generates a fourth output signal in response to the input selection signal, the first NAND gate driving the first output signal in response to the second output signal and in response to the third output signal.

8. A delay line as set forth in claim 7, further comprising a last delay element coupled to the second delay element, the last delay element comprising,
a fifth NAND gate coupled to the input selection line and coupled to the second NAND gate, the fifth NAND gate generating a fifth output in response to the input selection signal and in response to the second output signal, and
a sixth NAND gate coupled to the second NAND gate and coupled to the input selection line, the sixth NAND gate generating a sixth output signal in response to the selection signal and in response to the second output signal, the fourth NAND gate generating the fourth output signal in response to the sixth output signal, the selection signal, and VDD.

9. A delay line as set forth in claim 1, the plurality of delay line elements further comprising,
an input selection line generating an input selection signal;
a previous delay element passing the input signal;
a last delay element generating a return signal in response to the input selection signal;
a middle delay element coupled between the previous delay element and the last delay element, and coupled to the input selection line, the middle delay element comprising,
a first NAND gate capable of passing the input signal from the previous delay element to the last delay element; a second NAND gate receiving the input signal from the previous delay element and the selection signal from the input selection line, the second NAND gate capable of outputting a second signal to the previous delay element in response to the input signal and in response to the selection signal and a third NAND gate capable of outputting a third signal to the previous delay element in response to the selection signal and in response to the return signal.

10. A delay line as set forth in claim 9, wherein the previous delay element is implemented with a single NAND gate.

11. A delay line as set forth in claim 9, wherein the last delay element is implemented with two NAND gates.

* * * * *